United States Patent
Kuo

(10) Patent No.: US 7,198,464 B2
(45) Date of Patent: Apr. 3, 2007

(54) FRAME DEVICE OF A FAN

(75) Inventor: Wei-Chen Kuo, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 230 days.

(21) Appl. No.: 10/959,968

(22) Filed: Oct. 8, 2004

(65) Prior Publication Data
US 2006/0079169 A1    Apr. 13, 2006

(51) Int. Cl.
F01D 25/26    (2006.01)
(52) U.S. Cl. .................. 415/213.1; 415/214.1
(58) Field of Classification Search ................ 415/119, 415/177, 213.1, 214.1
See application file for complete search history.

(56) References Cited

U.S. PATENT DOCUMENTS

| 1,843,786 | A | * | 2/1932 | Robinson | 415/119 |
| 5,288,203 | A | * | 2/1994 | Thomas | 165/80.3 |
| D356,777 | S | * | 3/1995 | Katsui et al. | D13/179 |
| 5,409,352 | A | * | 4/1995 | Lin | 415/177 |
| 5,437,327 | A | * | 8/1995 | Chiou | 165/122 |
| 6,047,765 | A | * | 4/2000 | Zhan | 165/80.3 |
| D466,092 | S | * | 11/2002 | Hsieh | D13/179 |

* cited by examiner

Primary Examiner—Hoang Nguyen

(57) ABSTRACT

A frame device of a fan comprises a lower frame and a plurality of jut units. The lower frame is hollow. The jut units are disposed on the lower frame in a way of spacing apart from each other and extend upward and slant outward to constitute an entrance such that a plurality of elongated passages are formed for fluid flow. A fan wheel with a plurality of fan blades is associated with the lower frame. When the fan wheel rotates, more fluid can flow in the fan to enhance heat dissipation efficiency and reduce noise.

2 Claims, 5 Drawing Sheets

FIG 1 (PRIOR ART)
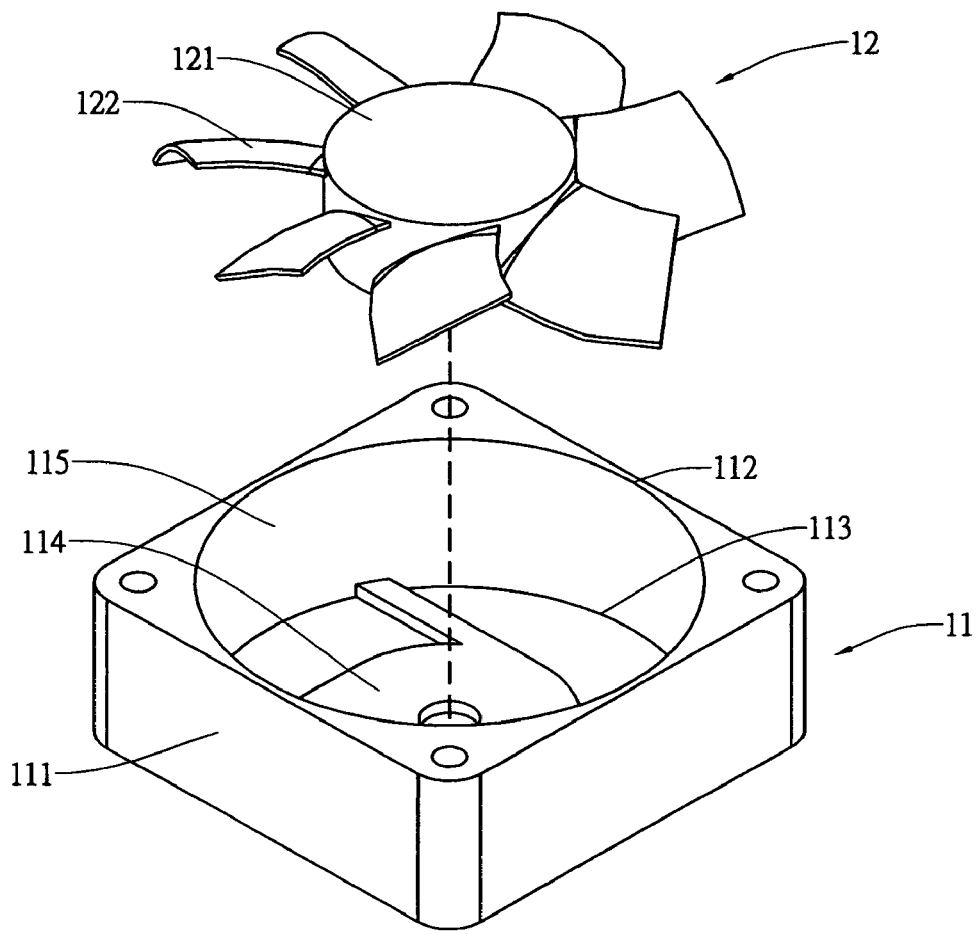
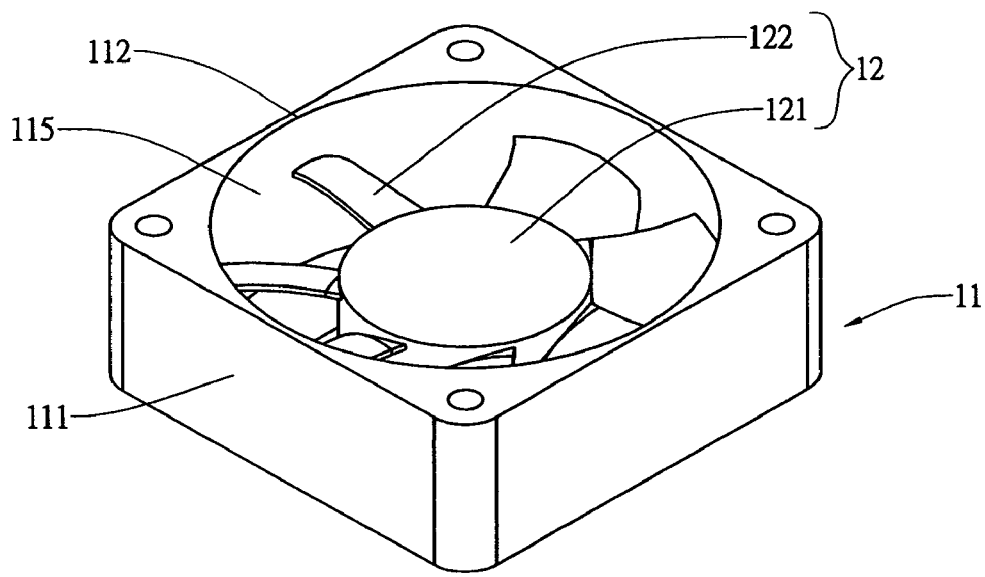
FIG 2 (PRIOR ART)

FIG 3 (PRIOR ART)
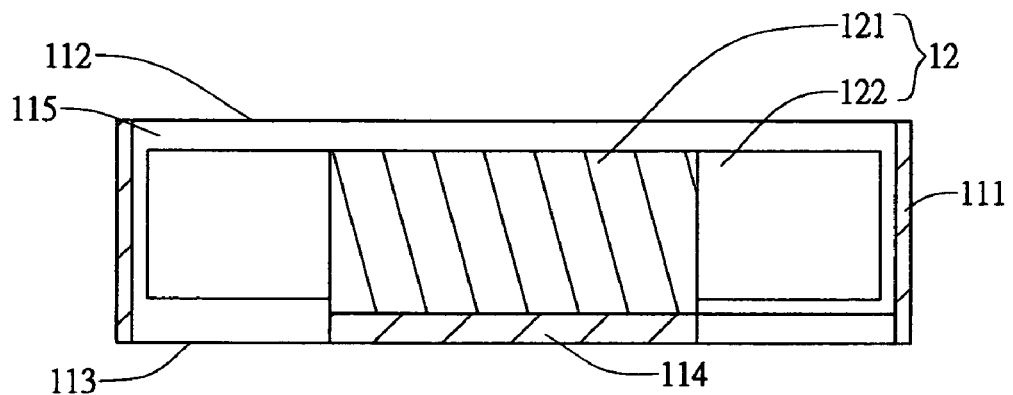
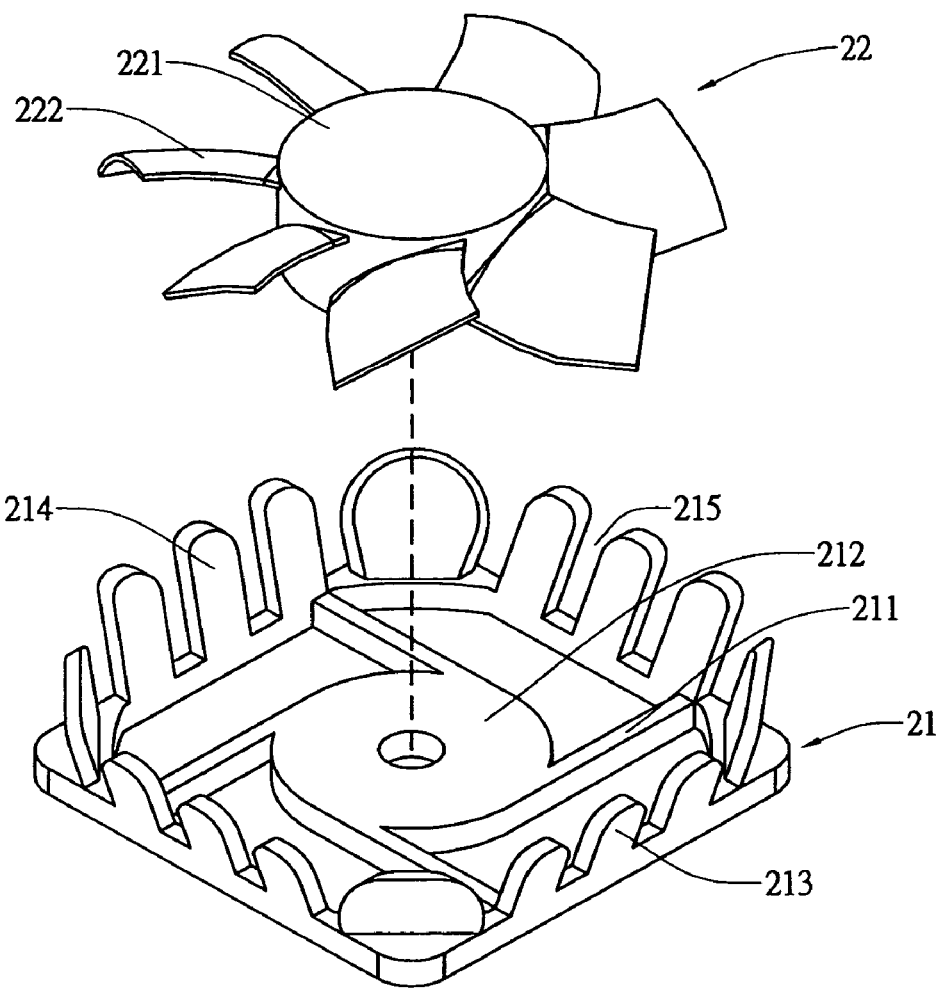
FIG 4

FIG 9
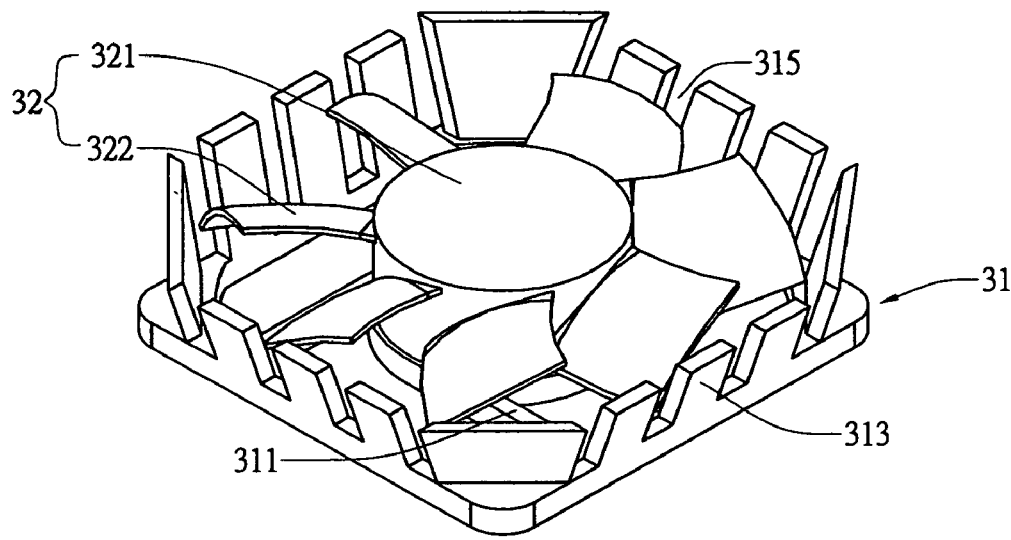
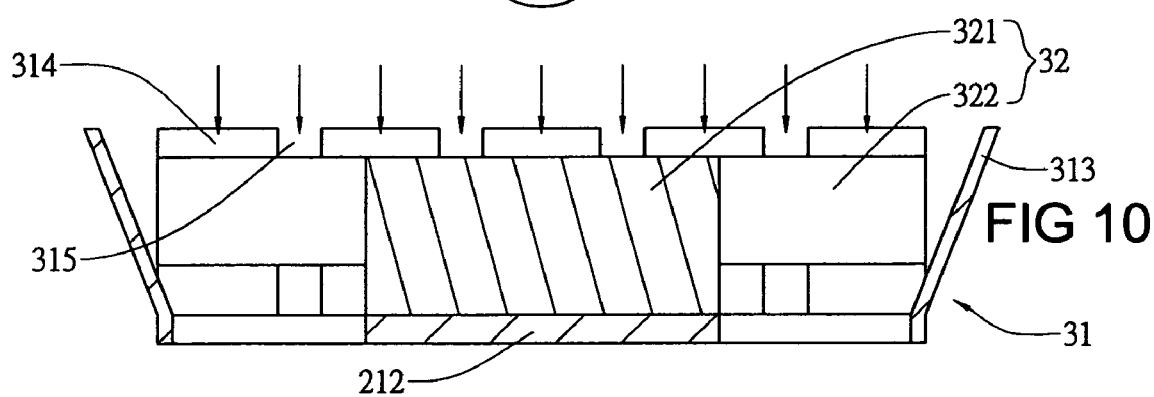
FIG 10
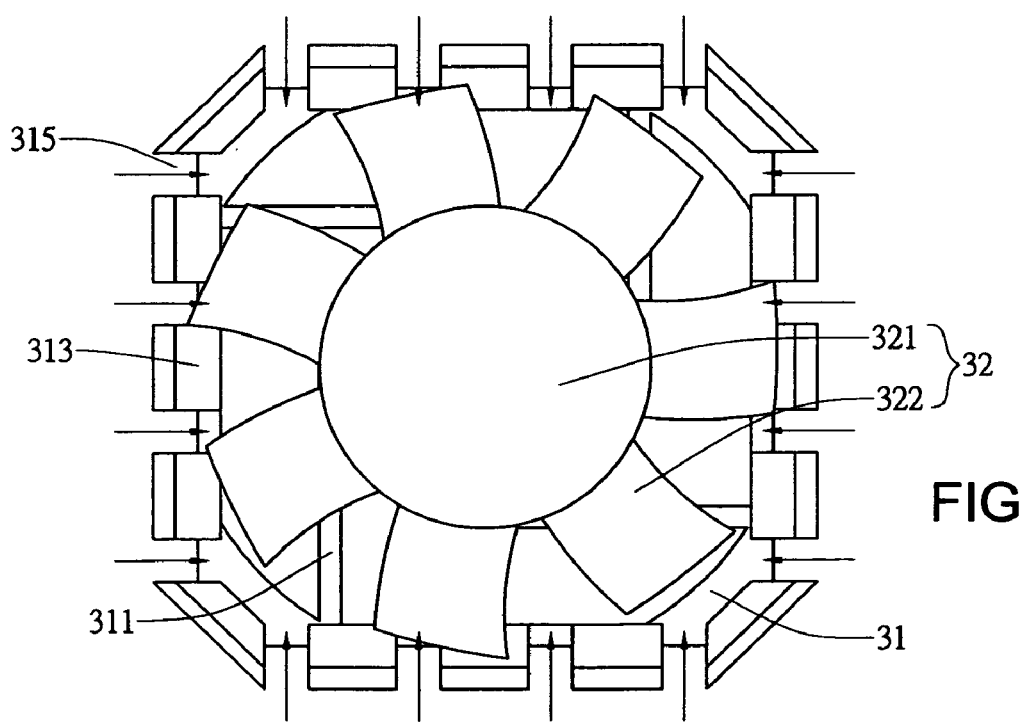
FIG 11

FRAME DEVICE OF A FAN

BACKGROUND OF THE INVENTION

1. Field of the Invention

The present invention is related to a fan frame device, particularly to a fan frame device of a cooling fan.

2. Brief Description of Related Art

Due to electronic products progressing rapidly, the running speeds of various electronic components in the electronic products are getting faster and data access rates thereof are getting increasing so that more heat is generated and it results in high temperature being kept in the electronic components. The computer is a typical one of the electronic products.

Originally, the main unit of a computer was designed without heat dissipation device except the cooling device attached to the power supplier helping to perform heat dissipation of the main unit. The heat dissipation has become an important factor for keeping running steadily in the recent year. Currently, the most popular heat dissipation device is fan and radiator, which carry out the heat dissipation job by way of convection and conduction.

The preceding radiator usually is made of aluminum alloy or copper and conductivity is a criterion to determine a good or bad radiator. Further, amount of the area contacting with flowing air is an essential factor influencing effect of heat dissipation. Hence, the more the surface area of the radiator contacts with the air, the better the effect of heat dissipation can be obtained.

The preceding fan provides a function of forcing cooling air passing over the surface of the radiator so that the faster the rotational speed of the fan is, the better the effect of heat dissipation is.

Therefore, computer components capable of generating a great deal of heat are designed with a function of heat dissipation. It requires the radiator only in case of the computer components generating less heat and it required the radiator associated with the fan in case of the computer components generating more heat. For instance, the chip module usually is attached with a radiator and the central processing unit (CPU) and graphic processing unit (GPU) on 3D accelerating card are attached with a radiator associated with a fan respectively.

In order to guarantee the CPU and the GPU operating safely and reliably, the method popularly used is to increase effective discharge power of the fan and the rotational speed of the fan respectively.

Further, referring to FIGS. 1 to 3, a conventional fan comprises a fan frame 11 and a fan wheel 12. The fan frame 11 provides a hollow case with a frame wall 111 and a flow passage 115 is defined with an inlet 112 and an outlet 113 being disposed at two lateral sides of the fan frame 11. A hub seat 114 is disposed in the flow passage 115 and the fan wheel 12 comprises a hub 121 and a plurality of fan blades 122 extending outward from the hub 121 in a radial direction. Then, the fan wheel 12 is movably attached to the hub seat 114. When the fan wheel 12 rotates, the fan blades 122 drags fluid to flow into the flow passage 115 via the inlet 112 from the fan frame 11 and flow out via the outlet 113.

However, a problem of the conventional fan in practice is in that the area of the inlet 112 available for the incoming fluid has been defined by the frame wall 111 so that only limited amount of fluid can be dragged by the fan and the radial pressure of fluid impacts the frame wall 111 to produce noise during the fluid moving into the flow passage 115.

SUMMARY OF THE INVENTION

A primary object of the present invention is to provide a fan frame device, in which a lower frame is surrounded with jut units spacing apart from each other to increase intake amount of the fluid and protect the fan blades of the fan wheel from hitting foreign objects.

Another object of the present invention is to provide a fan frame device with which noise resulting from flowing fluid can be reduced effectively.

A further object of the present invention is to provide a fan frame device, in which a lower frame is surrounded with jut units spacing apart from each other and extends upward and slant outward, so that it allows the fan blades of the fan wheel being increased the size thereof.

BRIEF DESCRIPTION OF THE DRAWINGS

The detail structure, the applied principle, the function and the effectiveness of the present invention can be more fully understood with reference to the following description and accompanying drawings, in which:

FIG. 1 is an exploded perspective view of the conventional fan;

FIG. 2 is an assembled perspective view of FIG. 1;

FIG. 3 is a sectional view of the conventional fan;

FIG. 4 is an exploded perspective view of the first preferred embodiment according to the present invention;

FIG. 9 is a perspective view of the second preferred embodiment according to the present invention;

FIG. 10 is a sectional view of the second embodiment according to the present invention; and FIG. 11 is a top view of the second embodiment according to the present invention illustrating movement of the fan.

DETAILED DESCRIPTION OF THE PREFERRED EMBODIMENT

Figure 5:
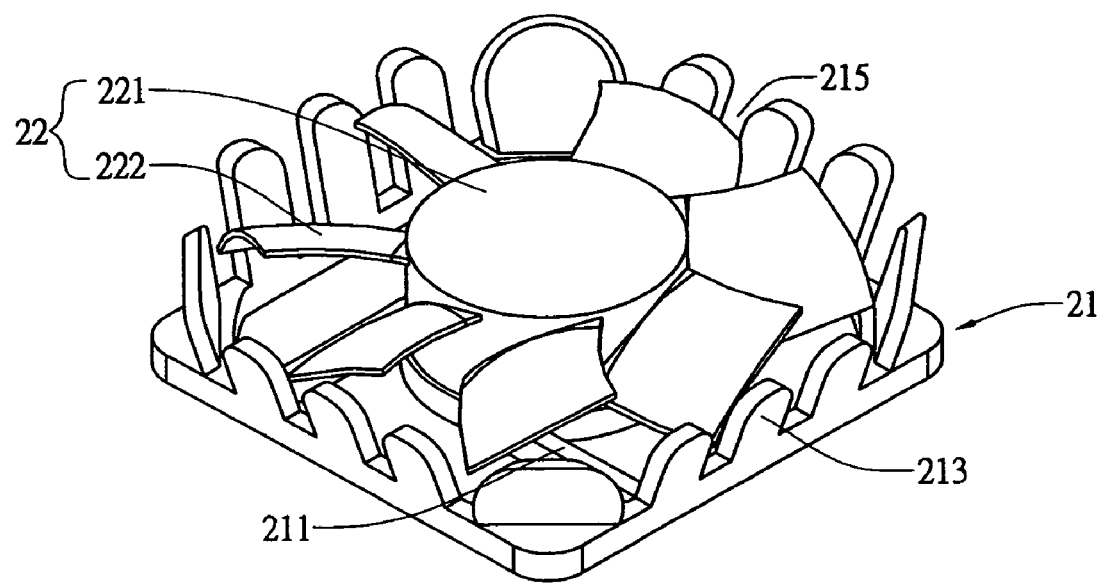
FIG. 5 is a perspective view of the first preferred embodiment according to the present invention.

Referring to FIGS. 4 and 5, a frame device of a fan in the first embodiment according to the present invention comprises a lower frame 21 and a fan wheel 22. The lower frame 21 is hollow with a support 211 connecting with the hub seat 212 and a plurality of jut units 213 extending from four sides of the frame 21. It can be seen in the figures that the jut units 213 at the four sides of the frame 21 provides a rectangular shapes with a circular top respectively. Further, four corners of the frame 21 has a triangular shape respectively and the jut units 213 disposed at the four corners basically provide an inverted trapezoidal shape with a circular top respectively. A plurality of elongated spaces 215 are formed between the jut units 213 and Further, the jut units 213 extend upward and slant with facial sides thereof inclining outward to form a room 214 for accommodating the fan wheel 22 such that air can be induced by the fan wheel 22 via upper side of the fan wheel 22 and the elongated spaces 215.

The fan wheel 22 comprises a hub 221 and a plurality of fan blades 222 extending outward from the hub 221. The fan wheel 22 is movably attached to the hub seat 212 such that the jut units 213 can increase intake air of the fluid.

Figure 6:
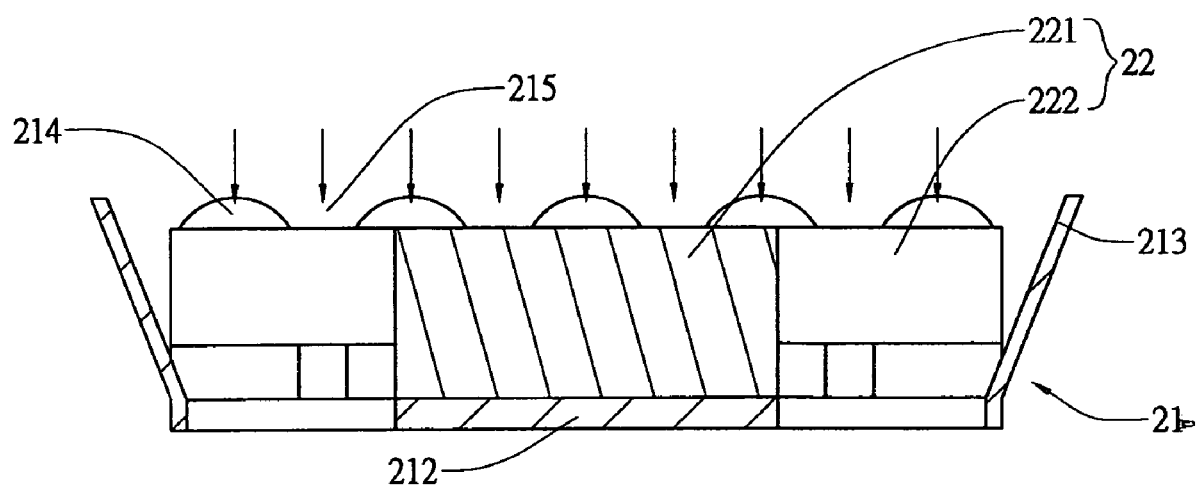
FIG. 6 is a sectional view of the first embodiment according to the present invention.
Figure 7:
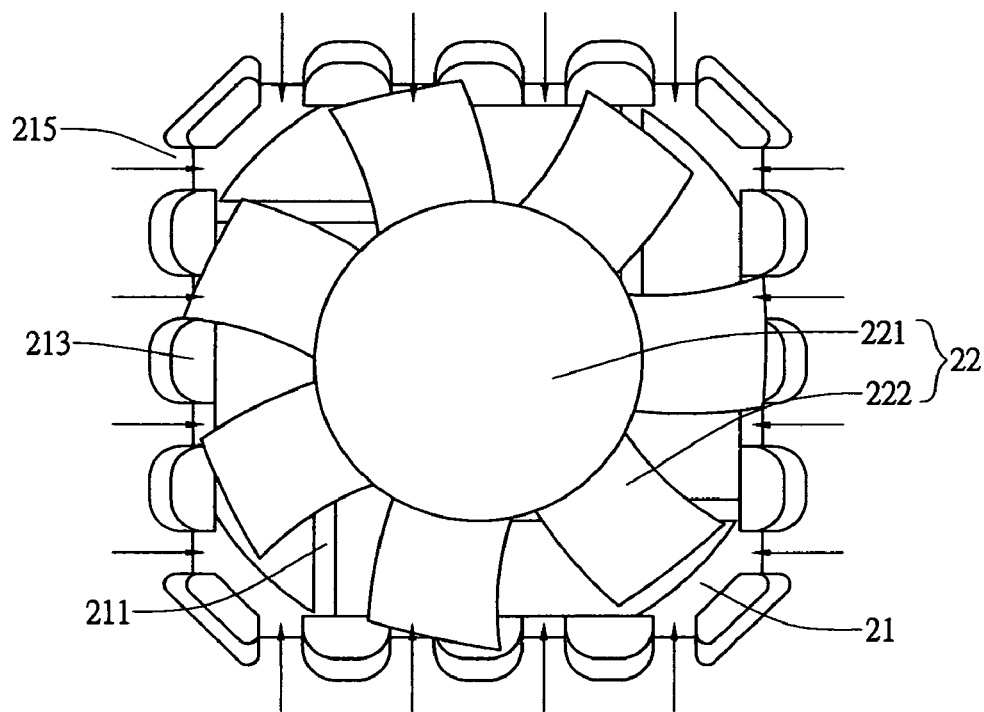
FIG. 7 is a top view of the first embodiment according to the present invention illustrating movement of the fan.
Figure 8:
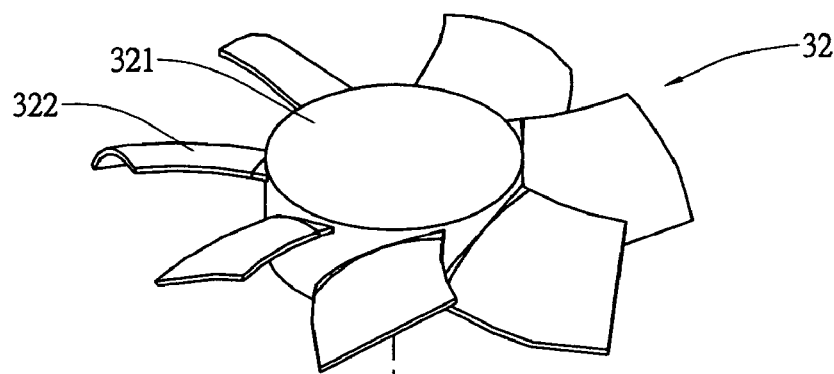
FIG. 8 is an exploded perspective view of the second preferred embodiment according to the present invention.
Figure 8:
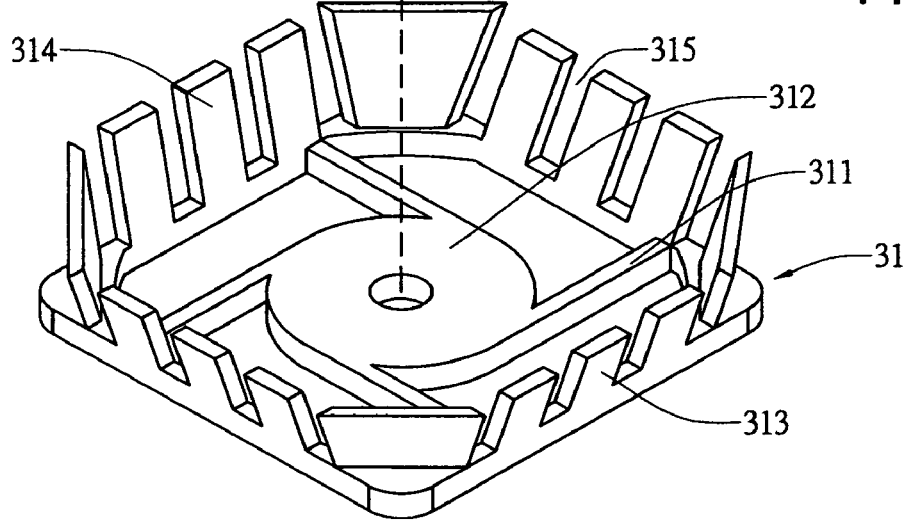

Referring to FIGS. 6 and 7, when the fan blades 222 of the fan wheel 22 rotate, a variable flow field generated to drag the fluid flowing into the entrance 214 and flowing out via the lower frame 21. Further, the fluid can move in via the elongated spaces 215 between the jut units 213 to increase the amount of the fluid dragged by the fan blades 222 and that of fluid flowing out of the lower support so that heat dissipation can be performed more efficiently.

Further, an upper area surrounding by the jut units 213 is greater than a lower area surrounding by the jut units 213 due to the jut units 213 extending upward and slanting outward such that the fan blades 222 can be increased the radial area thereof and greater amount of fluid can be dragged to enhance heat dissipation efficiency.

In addition, the provision of the jut units 213 overcomes problems occurring in the conventional fan such as the fluid impacting the frame wall and generating noise and foreign objects being hit by the fan blades.

Referring to FIGS. 8 to 11, the second preferred embodiment is illustrated. The structure of the fan in the second embodiment is similar to the first embodiment and no further detail will be described for the parts same the first embodiment. The difference of the second embodiment from the first embodiment is in that the lower frame 31 provides a plurality of rectangular jut units 313 being disposed to space apart from each other. The provision of the jut units 313 can enhance the efficiency of heat dissipation, reduce noise and allow the fan blades extending the radial area thereof respectively.

While the invention has been described with referencing to preferred embodiments thereof, it is to be understood that modifications or variations may be easily made without departing from the spirit of this invention, which is defined by the appended claims.

What is claimed is:

1. A frame device for a fan comprising:
   a square lower frame with four lateral sides and four triangular corners; providing a hub seat at a hollow space thereof for being joined to a hub of a fan wheel;
   a plurality of rectangular jut units, each of the rectangular jut units comprising a facial side and two opposite long lateral sides, and extending from the four lateral sides of the frame except the four corners; and
   an inverted trapezoidal jut unit with a facial side and two opposite slant lateral sides extending from the respective corner of the frame;
   wherein the facial sides of all the jut units are disposed to face the fan wheel and to surround the fan in a way of inclining outward an angle and a plurality of elongated spaces are formed between the jut units such that air, which is induced by the fan laterally, is capable of moving through the elongated spaces along a direction perpendicular to the four lateral sides of the frame.

2. The frame device for a fan as defined in claim 1, wherein each of the jut units has a circular top.

* * * * *